United States Patent [19]

Julien

[11] Patent Number: 5,139,537
[45] Date of Patent: Aug. 18, 1992

[54] TITANIUM-NITRIDE COATED GRINDING WHEEL AND METHOD THEREFOR

[76] Inventor: D. Lynn Julien, 918 N. 104th St., Apache Junction, Ariz. 85220

[21] Appl. No.: 714,635

[22] Filed: Jun. 13, 1991

[51] Int. Cl.$^5$ .............................................. B24D 3/00
[52] U.S. Cl. ....................................... 51/293; 51/295; 51/309
[58] Field of Search ......................... 51/293, 295, 309

[56] References Cited

U.S. PATENT DOCUMENTS

| | | | |
|---|---|---|---|
| 3,645,706 | 2/1972 | Bovenkerk | 51/295 |
| 4,011,064 | 3/1977 | Lee et al. | 51/295 |
| 4,095,961 | 6/1978 | Wirth | 51/295 |
| 4,399,167 | 8/1983 | Pipkin | 51/309 |
| 4,776,863 | 10/1988 | Van den Berg et al. | 51/295 |

*Primary Examiner*—William R. Dixon, Jr.
*Assistant Examiner*—Willie J. Thompson
*Attorney, Agent, or Firm*—Antonio R. Durando; Harry M. Weiss

[57] ABSTRACT

A titanium nitride coating is applied over the cubic boron nitride layer of conventional CBN tools by the process of arc physical-vapor-deposition at temperatures below the tempering temperature of the core metal. The titanium nitride coating stabilizes and reinforces the existing bond between the cubic boron nitride and the core, resulting in a grinding tool with greater efficiency and longer life. Specific operating conditions are required during the deposition process in order to ensure the proper level of adhesion of the titanium nitride layer.

12 Claims, No Drawings

TITANIUM-NITRIDE COATED GRINDING WHEEL AND METHOD THEREFOR

BACKGROUND OF THE INVENTION

1. Field of the Invention

This invention pertains to the general field of abrasive substances used to coat the cutting surfaces of metal working tools in order to improve their performance and longevity. In particular, it provides a new and improved way of applying a thin layer of titanium nitride coating over cubic boron nitride plated grinding wheels.

2. Description of the Prior Art

Abrasive substances are used for cutting, smoothing and polishing the surface of other hard materials. Naturally, in each instance the abrasive used must be harder than the surface it is working on in order to ensure proper performance and durability. Therefore, materials known for their high degree of hardness, such as diamond, aluminum oxide and silicon carbide, have long been used as the cutting edge of tools to improve their quality in grinding, sawing, lapping, machining and drilling. The resulting tools reduce production time and costs, and facilitate the maintenance of consistently high tolerances with little or no effect on the metallurgical integrity of the final product. Typically, the working surface of a tool made of steel or other metallic substrate is coated with a layer of harder and more abrasion-resistant material by chemical bonding, electrometallurgical deposition, or other methods of application. Thus, in addition to the properties of the abrasive material itself, the performance of the tool is affected by the quality and durability of the bonding between the abrasive particles and the tool substrate. U.S. Pat. No(s). 3,464,804, 3,645,706, 3,650,714, 3,859,057, 3,879,901 and 3,929,432 describe several processes and products directed at improving both of these critical characteristics in grinding tools.

Because of its hardness, for a long time diamond was the only abrasive capable of cutting very hard superalloys and composite materials, but it could not be used effectively on steels and other ferrous surfaces because of its tendency to react and be absorbed into such surfaces at the temperature and pressure conditions normally occurring in the grinding and machining process. A great improvement was achieved by the development of the synthetic superabrasive substance cubic boron nitride (CBN), marketed by the General Electric Company under the trademark "Borason," which exhibits abrasive properties comparable to diamond and can be used effectively for grinding hardened steels. In fact, the performance of CBN is far superior to that of aluminum oxide, the conventional abrasive used on hardened steel tools.

The manufacture of most CBN grinding wheels currently found in the industry is based on four major types of bonding techniques to incorporate the CBN cutting surface into the wheel's metal core, which generally consists of steel. These techniques include resin bonding, metal bonding, vitreous bonding and electroplating. The resulting CBN-coated grinding wheels are now routinely used (generally referred to as Borozon wheels) in the machining of hard ferrous metals, cast irons, and nickel-base and cobalt-base superalloys. They can produce more goods, to a higher degree of accuracy and at a lower cost than any other abrasive. In fact, the limiting factor in the life of such tools is typically determined not by wear on the cutting surface but by its break-down and separation from the metal core resulting from failure of the bonding layer.

Therefore, any process, material, or technique that might result in the lengthening of the life of Borozon wheels would be of great usefulness and commercial value to the industry. The present invention deals with a new of approach to strengthening the bond between the metal core (substrate) of the grinding wheel and the CBN layer on its cutting surface. The approach is based on the physical vapor deposition of titanium nitride on the CBN-bonded surface.

Nitrides and carbides have been used for some time in thin coatings to provide wear protection to moving parts of equipment and machinery. This protection has become particularly critical n recent years in automated production processes, where machine break-downs caused by wear of individual parts are a significant component of overall costs. Therefore, thin layers of these materials (specially titanium nitride) have proven very successful in reducing operating costs. They are extremely hard, abrasion-resistant, and adhere well to the supporting surface even in very thin layers, which is very important for the dimensional tolerances required for the coated part.

In general, the deposition of these thin layers of coating materials has been achieved at relatively high temperatures by chemical vapor deposition and by physical vapor deposition. Typically, though, titanium nitride is deposited at temperatures in the order of 1,200 to 1,700° F., which, when applied to Borozon wheels, tends to affect the integrity of the substrate and the stability of the CBN-steel bond. This invention is based on the discovery that the physical vapor deposition process can be used successfully at relatively low temperatures to produce titanium nitride coated Borozon wheels of improved durability and efficiency.

BRIEF SUMMARY OF THE INVENTION

One objective of this invention is the development of a CBN grinding tool with improved bonding between the cubic boron nitride layer and the metallic substrate in order to lengthen the efficiency and durability of the tool.

Another objective of the invention is a process for coating standard Borozon wheels with titanium nitride without causing distortion to the metal substrate of the wheel.

A further objective of this invention is the development of a coating process for standard wheels that produces a cutting surface within acceptable tolerances and does not require additional trueing of the coated wheel.

Accordingly, the present invention consists of a titanium nitride coating applied over the cubic boron nitride layer of conventional CBN tools by the process of arc physical-vapor-deposition at temperatures below the tempering temperature of the core metal. The titanium nitride coating stabilizes and reinforces the existing bond between the cubic boron nitride and the core, resulting in a grinding tool with greater efficiency and longer life. Specific operating conditions are required during the deposition process in order to ensure the proper level of adhesion of the titanium nitride layer.

Therefore, to the accomplishment of the objectives described above, this invention consists of the features hereinafter illustrated in the examples, fully described in the detailed description of the preferred embodiment and particularly pointed out in the claims. However, such examples and description disclose but one of the various ways in which the invention may be practiced.

DETAILED DESCRIPTION OF THE INVENTION

The heart of this invention lies in the discovery that the bonding between the CBN abrasive layer and the metallic substrate of CBN grinding wheels can be greatly strengthened by the deposition of a thin layer of titanium nitride coating. It appears that the titanium nitride penetrates the surface of the Borozon layer to bind with the molecules of the substrate, so as to create a direct bond between the exterior titanium nitride coating and the interior substrate. In addition, the deposition of titanium nitride on CBN wheels can be accomplished successfully at relatively low temperatures with the arc physical-vapor-deposition process. As a result of the low temperatures used in the process, the metal substrate of the wheel is not subjected to conditions that might cause loss of hardness and distortion, as has been the case in prior attempts to protect the CBN layer of Borozon wheels with titanium nitride through other conventional processes, such as the chemical vapor deposition process.

As is well understood by those skilled in the art, the arc physical-vapor-deposition process used for this invention is based on the ionization of metallic titanium produced by an electric arc in a low-pressure nitrogen atmosphere. Using the titanium as solid cathode material, the arc causes titanium ions to be liberated in plasma form from the surface of the cathode and accelerated with high energy by a voltage bias toward the material to be coated. The titanium ion cloud reacts with the free nitrogen in the atmosphere to form titanium nitride and is implanted at very high speed onto the substrate surface, resulting in a uniform thin layer of high adherence coating. Because of this uniform high energy bombardment, a distance of a few nanometers of the substrate surface is penetrated and changed to an alloy between the metal and the titanium nitride. It appears that this alloying process between the titanium nitride and the CBN bonding layer, as well as with the metallic structure of the core, produces the desired reinforcing bond that increases the stability of the CBN layer on the core and, correspondingly, the life of the wheel.

What is novel about this invention is the concept of using a titanium nitride coating to protect and stabilize the cubic boron nitride layer already bonded to the metal substrate (typically steel) of standard CBN grinding wheels in order to improve the characteristics of the bond, rather than the abrasive properties of the wheel. This was accomplished by the arc deposition process under an unconventional set of operating conditions that for the first time made it possible to achieve good adherence of the titanium nitride protective coating over the CBN abrasive layer without affecting the structural integrity of the part. Prior attempts, conducted at the normally high operating temperatures believed to be necessary to ensure proper adherence of the titanium nitride coating, resulted in distortion and loss of hardness of the wheel's metallic core. Trials at reduced temperatures alone, without the operating conditions refinements developed for this invention, resulted in poor adherence and no measurable performance improvement in the quality of the CBN wheels so treated.

In the preferred embodiment of the invention, Borazon wheels are successfully coated with a layer of titanium nitride by the method of arc physical-vapor-deposition at very low absolute pressure and under higher than normal bias voltages in a nitrogen atmosphere. Accordingly, a standard CBN wheel, of the kind commercially available, for example, as an electroplated Norton CBN-Grade 570 wheel, is first preheated to a temperature of about 450 to 475° F. in an arc evaporator chamber under vacuum. This is accomplished by intense titanium ion bombardment at a high bias voltage (for example, 1,000 V was used with the arc evaporation process marketed by Multi-Arc Scientific Coatings of Rockaway, New Jersey, under the trademark "Ion Bond," but it may vary, in ways that would be obvious to one skilled in the art, with different equipment), which causes the surface of the wheel to absorb much of the energy carried by the ions with a resulting rise in temperature and removal of impurities from the wheel. After the part has been uniformly preheated, the chamber is flushed with nitrogen to produce a nearly pure nitrogen atmosphere. A vacuum is then applied to reduce the absolute pressure in the chamber to about 25 millitors. The arc deposition process is then carried out at a bias voltage of approximately 150 V (this voltage may similarly vary depending on the equipment used) to form a titanium nitride coating 4 to 6 microns in thickness. The coated wheel is then allowed to cool in the nitrogen atmosphere in the chamber before it is retrieved.

Through a series of experiments at different temperatures, the inventor has discovered that comparable results can be achieved by also varying the level of vacuum applied to the nitrogen atmosphere in the chamber. Specifically, an acceptable degree of adhesion of the titanium nitride coating to standard CBN wheels can be obtained at operating temperatures ranging between 400 and 600° F. (both for preheating and for deposition), with corresponding absolute pressures ranging between 30 and 10 millitors, respectively. It is found that the appropriate pressure for a given temperature is determined by linear interpolation between these two values.

Although it is anticipated that the method of this invention would improve the performance of all kinds of CBN-bonded wheels, it was tested primarily with electroplated wheels. The titanium nitride coated CBN wheels produced by the arc physical-vapor-deposition process under these conditions have shown a remarkable improvement over uncoated wheels. Tested under the same operating conditions in the performance of common grinding tasks, on the average the coated wheels demonstrated a working life (defined as the time of utilization without failure) over six times greater than that of uncoated CBN wheels. When tested at greater than normal operating feed rates (such as 0.025 linear inches per minute, where the normal rate would be 0.002 inches per minute), the titanium nitride coated wheels were able to be used efficiently without failure while standard CBN wheels failed in short order. Moreover, it was found that the coated wheels could be run successfully at much slower speeds than acceptable with uncoated wheels (such as, for example, at 3,000 rpm where the normal speed would be 6,000 rpm). This, in turn, results in the availability of more power at the cutting face of the grinding machine which makes it possible to increase the linear feed rate. In addition, because the method of deposition can be controlled to produce a layer of uniform thickness within the tolerances allowed for most grinding applications, the coated wheels can be used without further trueing or conditioning. The following examples illustrate the improvements observed in a comparison of coated versus uncoated CBN wheels.

EXAMPLE 1

Performed to illustrate the coated wheel's ability to grind at higher linear feed rates than permissible at a given speed for uncoated wheels.
Type of Grinding Wheel: CBN 570, 60/80 Grit
Size of Grinding Wheel: 6.5"×0.75"
Grinding Machine: Springfield Grinder, Model 42
Part Machined: Inconel 718 Stator
Linear Feed Rate: 0.025 inches per minute
Grinding Wheel Speed: 3,000 rpm
Part Table Speed: 20 rpm The coated wheel machined 192 parts to specification before showing wear.

The uncoated wheel failed after the third part was machined.

EXAMPLE 2

Performed to illustrate the coated wheel's greater life when compared to an uncoated wheel under the same operating conditions.
Type of Grinding Wheel: CBN 570, 60/80
Size of Grinding Wheel: 6.0"×0.75"
Grinding Machine: Springfield Grinder, Model 42
Part Machined: Inconel 718 Stator
Linear Feed Rate: 0.017 inches per minute
Grinding Wheel Speed: 3,000 rpm
Part Table Speed: 17 rpm The coated wheel machined 213 parts to specification before showing wear.

The uncoated wheel failed after 28 parts were machined.

EXAMPLE 3

Performed to illustrate the coated wheel's greater life when compared to an uncoated wheel under the same operating conditions.
Type of Grinding Wheel: CBN 570, 60/80 Grit
Size of Grinding Wheel: 6.0"×0.75"
Grinding Machine: Springfield Grinder, Model 42
Part Machined: Inconel 718 Stator with Wasp Alloy Ring
Linear Feed Rage: 0.013 inches per minute
Grinding wheel Speed: 3,000 rpm
Part Table Speed: 20 rpm The coated wheel machined 163 parts to specification before showing wear.

The uncoated wheel failed after 23 parts were machined.

EXAMPLE 4

Performed to illustrate the coated wheel's greater life when compared to an uncoated wheel under the same operating conditions.
Type of Grinding Wheel: CBN 570, 60/80 Grit
Size of Grinding Wheel: 6.0"×0.75"
Grinding Machine: Springfield Grinder, Model 42
Part Machined: Mar-M Nozzle
Linear Feed Rage: 0.002 inches per minute
Grinding wheel Speed: 3,000 rpm
Part Table Speed: 17 rpm The coated wheel machined 134 parts to specification before showing wear.

The uncoated wheel failed after 26 parts were machined.

EXAMPLE 5

Performed to illustrate the coated wheel's greater life when compared to an uncoated wheel under the same operating conditions.
Type of Grinding Wheel: CBN 570, 60/80 Grit
Size of Grinding Wheel: 4.0"×0.75"
Grinding Machine: Springfield Frinder, Model 42
Part Machined: Inconel 713 Nozzle
Linear Feed Rate: 0.025 inches per minute
Grinding Wheel Speed: 6,000 rpm
Part Table Speed: 23 rpm The coated wheel machined 263 parts to specification before showing wear.

The uncoated wheel failed after 48 parts were machined.

Modifications to this procedure to fit particular models of CBN grinding wheels would be obvious to one skilled in the art. Furthermore, various changes in the details, steps and materials that have been described may be made by those skilled in the art within the principles and scope of the invention herein illustrated and defined in the appended claims. Therefore, while the present invention has been shown and described herein in what is believed to be the most practical and preferred embodiment, it is recognized that departures can be made therefrom within the scope of the invention, which is therefore not to be limited to the details disclosed herein but is to be accorded the full scope of the claims so as to embrace any and all equivalent methods and products.

I claim:

1. A method comprising the following steps:
   (a) preheating said CBN grinding wheel to a temperature between 400 and 600° F. in an arc evaporator chamber under vacuum, wherein metallic titanium is used as cathodic material; and
   (b) depositing a titanium nitride coating approximately 4 to 6 microns in thickness over said CBN grinding wheel in an arc evaporator chamber in a nitrogen atmosphere under an absolute pressure between 30 and 10 millitors, at a temperature between 400 and 600° F.

2. The method defined in claim 1, wherein said preheating temperature is 450° F.

3. The method defined in claim 1, wherein said deposition temperature is 450° F.

4. The method defined in claim 1, wherein said deposition pressure is 25 millitor.

5. The method defined in claim 1, wherein said deposition pressure and said deposition temperature are selected in pairs be linear interpolation within the given ranges.

6. The method defined in claim 1, further comprising the step of:
   (c) allowing the resulting titanium nitride coated CBN wheel to cool in said nitrogen atmosphere in said arc evaporator chamber before retrieving it.

7. A grinding tool comprising:
   (a) a metallic core with a cutting surface;
   (b) a layer of cubic boron nitride bonded to said cutting surface; and
   (c) a layer of titanium nitride deposited over said layer of cubic boron nitride in an arc evaporator chamber wherein said cubic boron nitride coated cutting tool is preheated to a temperature between 400 and 600° F. under vacuum with metallic titanium used as cathodic material, and wherein said layer of titanium nitride is deposited in a nitrogen atmosphere under an absolute pressure between 30 and 10 millitors and at a temperature between 400 and 600° F.

8. The grinding tool of claim 7, wherein said layer of titanium nitride is approximately 4 to 6 microns in thickness.

9. The grinding tool of claim 7, wherein said preheating temperature is 450° F.

10. The grinding tool of claim 7, wherein said deposition temperature is 450° F.

11. The grinding tool of claim 7, wherein said deposition pressure is 25 millitor.

12. The grinding tool of claim 7, wherein said deposition pressure and said deposition temperature are selected in pairs by linear interpolation within the given ranges.

* * * * *

UNITED STATES PATENT AND TRADEMARK OFFICE
CERTIFICATE OF CORRECTION

PATENT NO. : 5,139,537
DATED : August 18, 1992
INVENTOR(S) : D. Lynn Julien

It is certified that error appears in the above-indentified patent and that said Letters Patent is hereby corrected as shown below:

Column 6, Claim 1, line 35, insert --of improving the bond between the cubic-boron-nitride layer and the metal substrate of a CBN grinding wheel,--after "A method".

Signed and Sealed this

Ninth Day of November, 1993

Attest:

BRUCE LEHMAN

*Attesting Officer*           *Commissioner of Patents and Trademarks*